United States Patent
Gallagher et al.

(10) Patent No.: US 6,226,160 B1
(45) Date of Patent: May 1, 2001

(54) SMALL AREA MAGNETIC TUNNEL JUNCTION DEVICES WITH LOW RESISTANCE AND HIGH MAGNETORESISTANCE

(75) Inventors: William Joseph Gallagher, Ardsley, NY (US); Stuart Stephen Papworth Parkin, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/293,570

(22) Filed: Apr. 15, 1999

(51) Int. Cl.[7] .................................................... G11B 5/39
(52) U.S. Cl. ............................................................. 360/324.2
(58) Field of Search ........................ 360/324.2; 365/158, 365/171, 173

(56) References Cited

U.S. PATENT DOCUMENTS

| | | | |
|---|---|---|---|
| 5,390,061 | 2/1995 | Nakatani et al. ................... 360/113 |
| 5,640,343 | 6/1997 | Gallagher et al. .................... 365/171 |
| 5,650,958 | 7/1997 | Gallagher et al. .................... 365/173 |
| 5,729,410 | 3/1998 | Fontana, Jr. et al. ............... 360/113 |
| 5,764,567 | 6/1998 | Parkin ................................. 365/173 |
| 6,023,395 | * | 2/2000 | Dill et al. ............................. 360/113 |
| 6,083,764 | * | 7/2000 | Chen .......................................... 438/3 |
| 6,097,579 | * | 8/2000 | Gill .................................. 360/324.2 |

* cited by examiner

*Primary Examiner*—William Klimowicz
(74) *Attorney, Agent, or Firm*—Thomas R. Berthold (57) ABSTRACT

A magnetic tunnel junction (MTJ) device has sufficiently small area to make it commercially practical as both a magnetic memory cell and a magnetoresistive read head. The small area magnetic tunnel junction device has both low resistance and high magnetoresistance. The magnetic tunnel junction device is made possible by the use of a thin aluminum layer in a thickness range of approximately 5–12 Angstroms. The Al layer is completely oxidized, without oxidizing the adjacent ferromagnetic layers, to form the insulating tunnel barrier layer of the MTJ.

6 Claims, 10 Drawing Sheets

SMALL AREA MAGNETIC TUNNEL JUNCTION DEVICES WITH LOW RESISTANCE AND HIGH MAGNETORESISTANCE

TECHNICAL FIELD

This invention relates to magnetic tunnel junction (MTJ) magnetoresistive (MR) devices for use as read heads for reading magnetically-recorded data and as memory cells in nonvolatile magnetic random access memory (MRAM) arrays.

BACKGROUND OF THE INVENTION

A magnetic tunnel junction (MTJ) device is comprised of at least two ferromagnetic layers separated by a thin insulating tunnel barrier layer and is based on the phenomenon of spin-polarized electron tunneling. The insulating tunnel barrier layer is thin enough that quantum mechanical tunneling occurs between the ferromagnetic layers. The tunneling phenomenon is electron-spin dependent, making the magnetic response of the MTJ a function of the relative orientations and spin polarizations of the two ferromagnetic layers. MTJ devices have been proposed as memory cells for nonvolatile solid state memory and as external magnetic field sensors, such as MR read sensors or heads for magnetic recording systems. For a memory cell application one of the ferromagnetic layers in the MTJ has its magnetic moment fixed or pinned so as to be parallel or antiparallel to the magnetic moment of the other free or sensing ferromagnetic layer in the absence of an applied magnetic field within the cell. For a MR field sensor or read head application one of the ferromagnetic layers has its magnetic moment fixed or pinned so as to be generally perpendicular to the magnetic moment of the free or sensing ferromagnetic layer in the absence of an external magnetic field. The use of an MTJ device as a memory cell in an MRAM array is described in IBM's U.S. Pat. No. 5,640,343. The use of an MTJ device as a MR read head has been described in U.S. Pat. No. 5,390,061 and in IBM's U.S. Pat. Nos. 5,650,958; 5,729,410 and 5,764,567.

What is important for MTJ device applications is the signal-to-noise ratio (SNR). The magnitude of the signal is dependent upon the magnetoresistance or MR ($\Delta R/R$) exhibited by the device. The signal is given by $i_B \Delta R$, which is the bias current ($i_B$) passing through the MTJ device (assuming a constant current is used to detect the signal) times the resistance change ($\Delta R$) of the device. However, the noise exhibited by the MTJ device is determined, in large part, by the resistance R of the device. It is well known that any conductor exhibits thermal noise commonly referred to as Johnson-Nyquist noise. The magnitude of the Johnson-Nyquist noise can be expressed as the root mean square voltage across the resistor, $V_J=(4k_B TR\Delta f)^{1/2}$. Thus if the noise introduced by the Johnson-Nyquist noise is the dominant noise source (i.e., the measurement electronics do not introduce any significant noise compared to the Johnson-Nyquist noise) then the SNR will be given by $i_B^2 \Delta R^2 / (4k_B TR\Delta f)$, where $k_B$ is Boltzmann's constant, T is the absolute temperature, R is the resistance of the device, and $\Delta f$ is the bandwidth of the measurement electronics. Thus to obtain the maximum SNR for constant power used to sense the device the resistance (R) of the device must be small and the change in resistance ($\Delta R$) of the device large.

The resistance of a MTJ device is largely determined by the resistance of the insulating tunnel barrier layer for a device of given dimensions since the resistance of the metal layers in the MTJ device, for example, the electrical leads and the ferromagnetic layers, contribute little to the resistance. Moreover, because the sense current passes perpendicularly through the ferromagnetic layers and the tunnel barrier layer, the resistance of a MTJ device increases inversely with the area of the device. This is in contrast to conventional MR devices, such as those based on the anisotropic magnetoresistance (AMR) effect and the giant magnetoresistance (GMR) effect, where the sense current passes parallel to the layers. Prior art MTJ devices have resistance values ($\sim 10^4$–$10^9$ $\Omega$) that are several orders of magnitude higher than the resistance values of conventional AMR or GMR devices ($\sim 10$–$40$ $\Omega$) of the same size, which means that the noise they exhibit is also much higher than conventional AMR or GMR devices.

The requirement for low resistance MTJ devices, coupled with the inverse relationship of resistance with area, is especially troublesome because an additional requirement for MTJ device applications is small area. For MRAM applications the density of the array depends on small area MTJ cells. For read head applications, high storage density on the media requires that the trackwidth (TW) be small (the area of the MTJ device is given by h×TW, where h is the height of the MTJ).

Since the resistance R of a MTJ device scales inversely with the area A, it is convenient to characterize the resistance of the MTJ device by the specific resistance, i.e., the product of the resistance R times the area A. Thus the specific resistance, $R_S$, is independent of the area A of the MTJ device.

The specific resistance $R_S$ of prior art MTJ devices has ranged from more than $10^9$ $\Omega(\mu m)^2$ down to $\sim 10^3$ $\Omega(\mu m)^2$. For example, in 1992 J. Nowak et al. (*J. Magn. Mat.* 109, 79–90 (1992)) reported specific resistance values of $\sim 10^8$–$10^9$ $\Omega(\mu m)^2$ in Fe/GdO$_x$/Fe junctions, although these junctions exhibited very small magnetoresistance ($\Delta R/R$) values of $\sim 0.7\%$. In 1995 T. Miyazaki et al. reported magnetoresistance values of up to 18% at 300 K in Fe/Al$_2$O$_3$/Fe planar tunnel junctions for which the specific resistance was $\sim 6 \times 10^3$ $\Omega(\mu m)^2$. However, these junctions were formed with very large areas, A~1×1 mm$^2$, which suggests that the measured magnetoresistance values were not intrinsic values but were enhanced by non-uniform current flow through the large-area junctions, as originally discovered in work on Josephson junctions (R. J. Pedersen et al., *Applied Physics Letters*, 10, 29 (1967)). In 1996 J. S. Moodera, et al (*Phys. Rev. Lett.* 74, 3273 (1996)) observed magnetoresistance values of ~10% at room temperature in planar tunnel junctions of area A=0.3×0.3 mm$^2$ but the specific resistance of these junctions was very high at ~$10^9$ $\Omega(\mu m)^2$. In 1996 S. S. P. Parkin et al. (*J. Appl. Phys.* 81, 5521 (1997)) reported magnetoresistance values of up to 25% at room temperature in planar exchange biased magnetic tunnel junctions with specific resistance values of ~$10^6$ $\Omega(\mu m)^2$ for junctions with areas of ~0.1×0.1 mm$^2$. Also in 1996 W. J. Gallagher et al. (*J. Appl. Phys.* 81, 3741 (1997)) reported magnetoresistance values of up to 20% at room temperature in junctions with specific resistance values of ~$5 \times 10^4$ $\Omega(\mu m)^2$ for junctions ranging in size from approximately 100 $\mu$m×100 $\mu$m (10,000 $\mu m^2$) down to junctions with sub-micron dimensions.

The prior art that describes magnetic tunnel junctions with relatively low specific resistance values also suggests that these devices have other undesirable properties, such as unacceptably low magnetoresistance, and are made with complicated processes. For example, in 1997 H. Tsuge et al. (*Appl. Phys. Lett.* 71, 3296 (1997)) reported Fe/Al$_2$O$_3$/CoFe/ junctions in which the tunnel barrier layer was formed by first depositing Al layers 2 nm thick using electron beam evaporation and then exposing these layers to oxygen. These junctions exhibited $R_S$ values of ~$1.5 \times 10^3$ $\Omega(\mu m)^2$ but very low magnetoresistance values of ~5% at room temperature. Only one Al thickness was reported and no studies of the dependence of the junction resistance on deposited Al thickness were reported and thus no method for controlling or varying the barrier thickness was indicated. The authors suggested that the use of an in-situ deposited barrier aluminum layer and oxidation of this layer in the vacuum chamber without breaking vacuum are the critical steps to obtaining a low resistance tunnel barrier irrespective of the thickness of the deposited Al layer. P. K. Wong et al. (J. Appl. Phys. 83, 6697 (1998)) reported Nb/Fe/Al2O3/CoFe/Nb magnetic tunnel junctions with $R_S$. values of ~$10^3$ $\Omega(\mu m)^2$ but with relatively low magnetoresistance values of ~6% at room temperature. The layers forming the junctions were deposited in a liquid nitrogen cooled chamber and the authors claimed that the relatively low specific resistance values were obtained by a complicated method of forming the tunnel barrier layer by successively depositing thin Al layers and oxidizing each layer by exposure to oxygen before depositing the next layer. The authors first deposited an Al layer 1 nm thick, oxidized it and then deposited multiple 0.1 nm thick Al layers, oxidizing each layer before deposition of the next layer. The authors asserted that this method avoids pin-holes in the Al layer which would otherwise lead to leakage of current and consequently reduced magnetoresistance. M. Sato et al. (IEEE Trans. Magn. 33, 3553 (1997)) reported exchange biased magnetic tunnel junctions similar in structure to those previously reported by S. S. P. Parkin et al. (J. Appl. Phys. 81, 5521 (1997)) and also similarly prepared their junctions using shadow or contact metal masks to define the area of the tunnel junction. The authors reported that only junctions with Al barriers oxidized for greater than 100 hours showed stable resistance values which do not change with time, whereas junctions oxidized for shorter times showed unreproducible properties which change with time. Junctions oxidized for greater than 100 hours displayed specific resistance values greater than $10^4$ $\Omega(\mu m)^2$ and magnetoresistance values in the range of 10–15% at room temperature.

Thus, the prior art magnetic tunnel junction devices have specific resistance values that are so high that the SNR is unacceptably low, have magnetoresistance values that are too low, can only be made with unacceptably large areas, and/or are made with commercially impractical processes. What is needed is a magnetic tunnel junction device capable of use as a memory cell or a read head that can be made in a commercially practical manner and that has small area, low specific resistance and high magnetoresistance.

SUMMARY OF THE INVENTION

The present invention is a magnetic tunnel junction (MTJ) device that has sufficiently small area to make it commercially practical as both a magnetic memory cell and a magnetoresistive read head. The small area magnetic tunnel junction device has both low resistance and high magnetoresistance. The magnetic tunnel junction device is made possible by the use of a thin aluminum layer in a thickness range of approximately 5–12 Angstroms. The Al layer is completely oxidized, without oxidizing the adjacent ferromagnetic layers, to form the insulating tunnel barrier layer of the MTJ.

The MTJ device of the present invention has applications as a MTJ memory cell and as a MR sensor for use as an external magnetic field sensor or a read head in magnetic recording systems, such as magnetic recording disk drives and tape systems.

For a fuller understanding of the nature and advantages of the present invention, reference should be made to the following detailed description taken together with the accompanying figures.

DETAILED DESCRIPTION OF THE INVENTION

Prior Art MTJ Memory Cell

Figure 1:
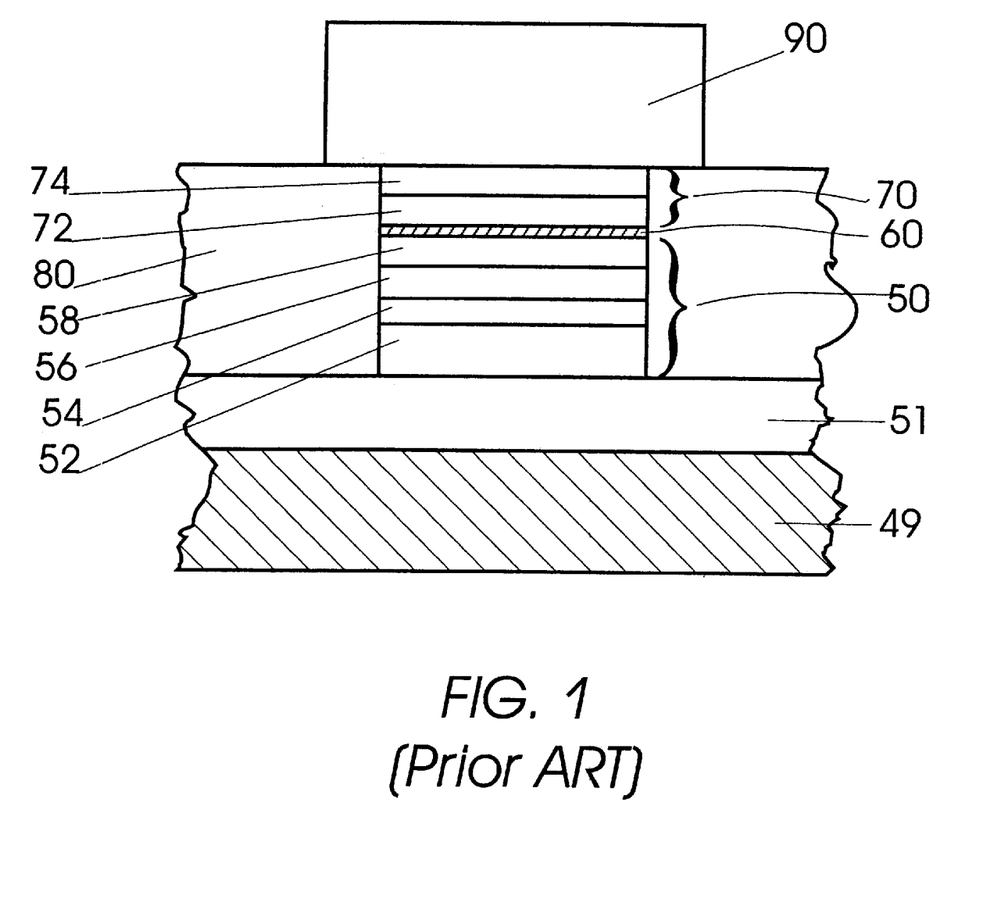
FIG. 1 is a cross-sectional view of a prior art MTJ device configured for a memory cell application.

For purposes of understanding the present invention, the MTJ devices in IBM's U.S. Pat. Nos. 5,650,958 and 5,640, 343 will first be described. FIG. 1 illustrates schematically a MTJ structure suitable for a magnetic memory cell application. The structure, shown in cross-section in FIG. 1, comprises a substrate 49, a wiring layer 51, a base electrode multilayer stack 50, an insulating tunnel barrier layer 60, a top electrode stack 70, an insulating layer 80 with a contact hole through it, and a contact and top wiring layer 90 that itself may be a multilayer structure. The tunnel barrier layer 60 is sandwiched between the two ferromagnetic layer stacks 50 and 70.

The base electrode layer stack 50 formed on the wiring layer 51 on the substrate 49 includes a first seed layer 52 deposited on substrate 49, a "template" ferromagnetic layer 54 on the seed layer 52, a layer of antiferromagnetic material 56 on the template layer 54, and a "fixed" or "pinned" ferromagnetic layer 58 formed on and exchange coupled with the underlying antiferromagnetic layer 56. The ferromagnetic layer 58 is called the pinned layer because its magnetic moment (magnetization direction) is prevented from rotation in the presence of applied magnetic fields in the desired range of interest for the MTJ device. The top electrode stack 70 includes a "sensing" or "free" ferromagnetic layer 72 and a protective layer 74 formed on the free layer 72. The magnetic moment of the ferromagnetic layer 72 is not pinned by exchange coupling, and is thus free to rotate in the presence of applied magnetic fields in the range of interest, i.e., magnetic fields caused by write currents passed through electrical lines in proximity to the MTJ device, such as through wiring layer 51. Both of the ferromagnetic layers 58 and 72 in electrode stacks 50 and 70, respectively, are fabricated so as to have their easy axes of magnetization generally parallel to one another in the same direction parallel to the length of the bottom wiring layer 51, which is formed as the extensions of base electrode 50. The pinned ferromagnetic layer 58 in stack 50 just beneath the insulating tunnel barrier layer 60 has its magnetization pinned by interfacial exchange coupling with the immediately underlying antiferromagnetic layer 56, which also forms part of base electrode stack 50. For magnetic fields of magnitude comparable to those applied to the memory cell during read and write operations of the cell, there is only one possible orientation for the magnetization of the pinned ferromagnetic layer 58. While the MTJ device is shown and described with the use of an antiferromagnetic exchange coupling layer 56 for pinning the fixed ferromagnetic layer 58, the layer 58 may also have its magnetic moment fixed by forming it of a hard high coercivity material. The free ferromagnetic layer 72 in top electrode stack 70 is anisotropic in its magnetization properties, but its magnetization direction or vector is not pinned. Rather, its magnetization vector can be stably oriented along either direction of the easy axis by the application of a magnetic field in the desired range.

The probability of tunneling of charge carriers across the tunnel barrier depends on the relative alignment of the magnetic moments of the two ferromagnetic layers. The tunneling current is spin polarized, which means that the electrical current passing from one of the ferromagnetic layers is predominantly composed of electrons of one spin type (spin up or spin down, depending on the orientation of the magnetization of the ferromagnetic layer). The degree of spin polarization of the current is determined by the electronic properties of the magnetic material comprising the ferromagnetic layer at the interface of the ferromagnetic layer with the tunnel barrier. The first ferromagnetic layer thus acts as a spin filter. The probability of tunneling of the charge carriers depends on the availability of electronic states of the same spin polarization as the spin polarization of the electrical current in the second ferromagnetic layer. Usually, when the magnetic moment of the second ferromagnetic layer is parallel to the magnetic moment of the first ferromagnetic layer, there are more available electronic states than when the magnetic moment of the second ferromagnetic layer is aligned antiparallel to that of the first ferromagnetic layer. Thus, the tunneling probability of the charge carriers is highest when the magnetic moments of both layers are parallel, and is lowest when the magnetic moments are antiparallel. When the moments are arranged, neither parallel nor antiparallel, the tunneling probability takes an intermediate value. Thus, the electrical resistance of the MTJ memory cell depends on the spin polarization of the electrical current and the electronic properties of both of the ferromagnetic layers. As a result, the two possible magnetization directions of the free ferromagnetic layer uniquely define two possible bit states (0 or 1) of the memory cell.

Prior Art MR Read Heads

Figure 2:
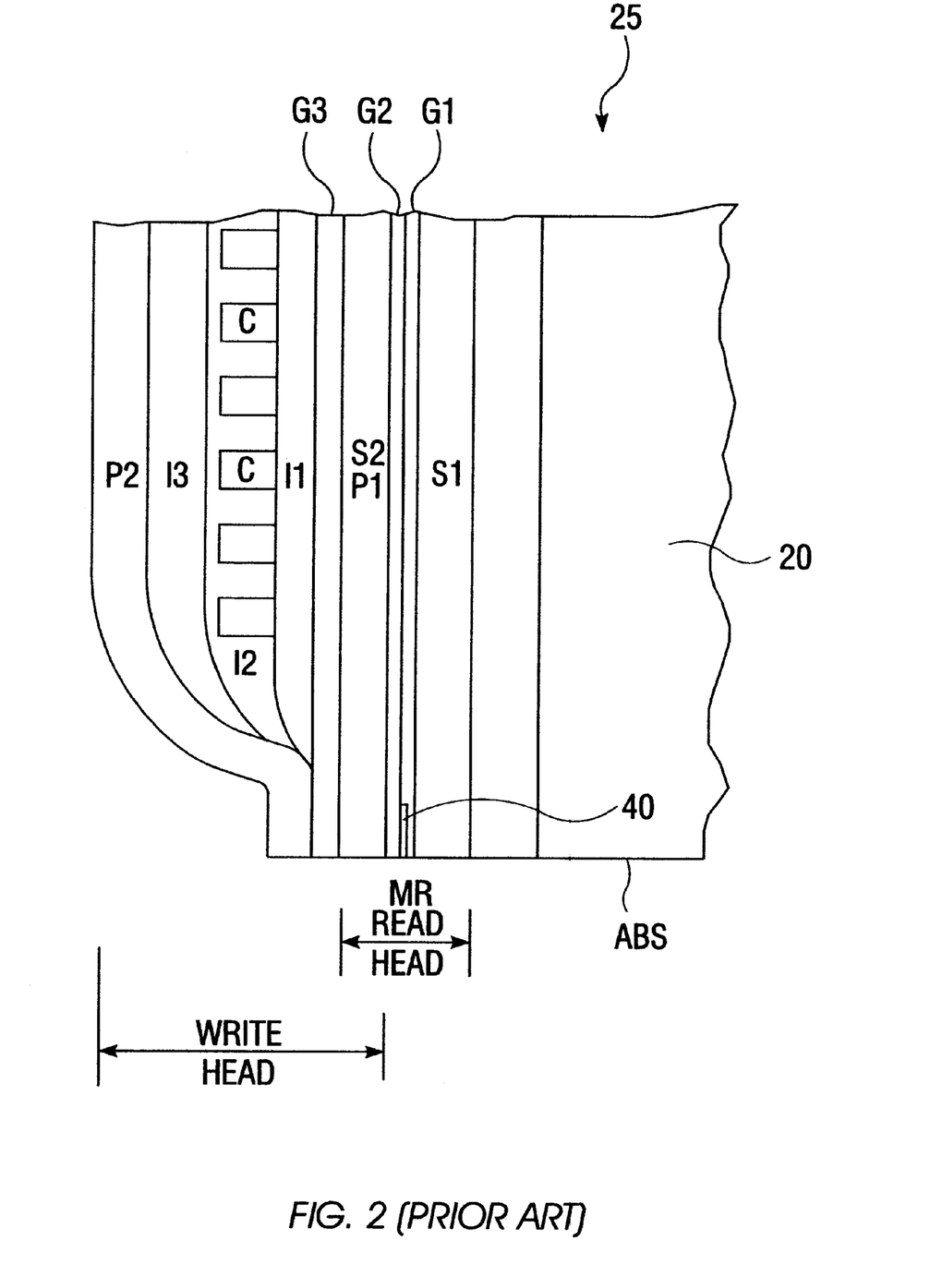
FIG. 2 is a vertical cross-sectional of a conventional inductive write head/MR read head with the MR read head located between shields and adjacent to the inductive write head.

FIG. 2 is a cross-sectional schematic view of a read/write head 25 which includes a MR read head portion and an inductive write head portion. The head 25 is lapped to form an air-bearing surface (ABS), the ABS being spaced from the surface of a rotating disk when the head 25 is used in a disk drive. The read head includes a MR sensor 40 sandwiched between first and second gap layers G1 and G2 which are, in turn, sandwiched between first and second shield layers S1 and S2. In a conventional disk drive, the MR sensor 40 is an anisotropic MR (AMR) sensor or a giant MR (GMR) sensor based on the spin-valve effect. The write head includes a coil layer C and insulation layer I2 which are sandwiched between insulation layers I1 and I3 which are, in turn, sandwiched between first and second pole pieces P1 and P2. A gap layer G3 is sandwiched between the first and second pole pieces P1, P2 at their pole tips adjacent to the ABS for providing a magnetic gap. During writing, signal current is conducted through the coil layer C and flux is induced into the first and second pole layers P1, P2 causing flux to fringe across the pole tips at the ABS. This flux magnetizes circular tracks on the rotating disk during a write operation. During a read operation, magnetized regions on the rotating disk inject flux into the MR sensor 40 of the read head, causing resistance changes in the MR sensor 40. These resistance changes are detected by detecting voltage changes across the MR sensor 40. The voltage changes are processed by the disk drive electronics and converted into user data. The combined head 25 shown in FIG. 2 is a "merged" head in which the second shield layer S2 of the read head is employed as a first pole piece P1 for the write head. In a piggyback head (not shown), the second shield layer S2 and the first pole piece P1 are separate layers.

Figure 3:
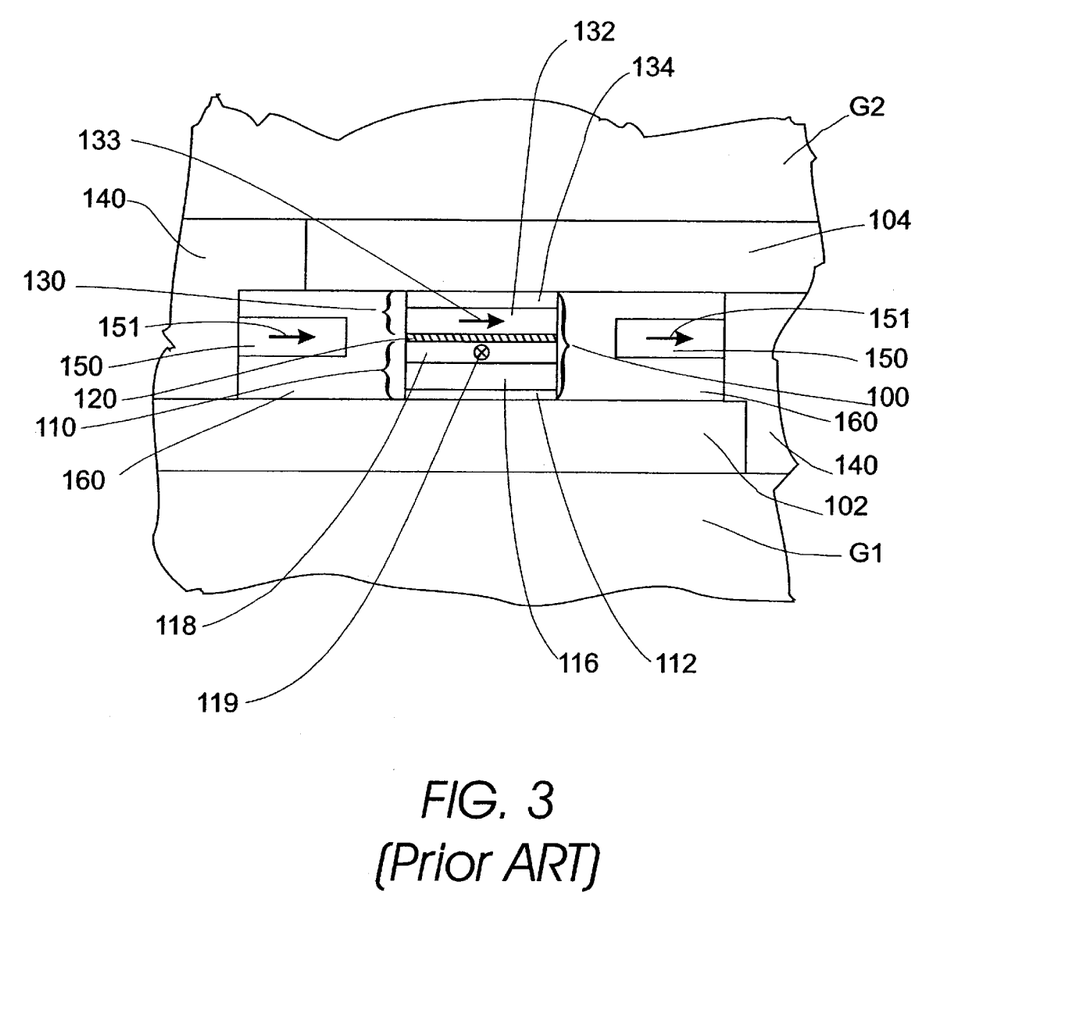
FIG. 3 is a cross-sectional view of a prior art MTJ MR read head as viewed from the air-bearing surface (ABS).

FIG. 3 is an illustration of a MTJ MR read head that can serve as the MR sensor 40 in FIG. 2. The MTJ MR read head is shown as viewed from the magnetic medium and includes a bottom electrical lead 102 formed on the gap layer G1 substrate, a top electrical lead 104 below gap layer G2, and the MTJ 100 formed as a stack of layers between top and bottom electrical leads 102, 104.

The MTJ 100 includes a first electrode multilayer stack 110, an insulating tunnel barrier layer 120, and a top electrode stack 130. Each of the electrodes includes a ferromagnetic layer in direct contact with tunnel barrier layer 120, i.e., ferromagnetic layers 118 and 132.

The base electrode layer stack 110 formed on electrical lead 102 includes a seed or "template" layer 112 on the lead 102, a layer of antiferromagnetic material 116 on the template layer 112, and a "fixed" ferromagnetic layer 118 formed on and exchange coupled with the underlying antiferromagnetic layer 116. The top electrode stack 130 includes a "sensing" ferromagnetic layer 132 and a protective or capping layer 134 formed on the sensing layer 132. The sensing ferromagnetic layer 132 is not exchange coupled to an antiferromagnetic layer, and its magnetization direction is thus free to rotate in the presence of applied magnetic fields in the range of interest. The sensing ferromagnetic layer 132 is fabricated so as to have its magnetic moment or magnetization direction (shown by arrow 133) oriented generally parallel to the ABS (FIG. 2) and generally perpendicular to the magnetization direction (arrow tail 119) of the fixed ferromagnetic layer 118 in the absence of an applied magnetic field. The fixed ferromagnetic layer 118 in electrode stack 110 just beneath the tunnel barrier layer 120 has its magnetization direction fixed by interfacial exchange coupling with the immediately underlying antiferromagnetic layer 116, which also forms part of bottom electrode stack 110. The magnetization direction of the fixed ferromagnetic layer 118 is oriented generally perpendicular to the ABS, i.e., out of or into the paper in FIG. 3 (as shown by arrow tail 119).

Also shown in FIG. 3 is a biasing ferromagnetic layer 150 for longitudinally biasing the magnetization of the sensing ferromagnetic layer 132, and an insulating layer 160 separating and isolating the biasing layer 150 from the sensing ferromagnetic layer 132 and the other layers of the MTJ 100. The biasing ferromagnetic layer 150 is a hard magnetic material, such as a CoPtCr alloy, that has its magnetic moment (shown by arrow 151) aligned in the same direction as the magnetic moment 133 of the sensing ferromagnetic layer 132 in the absence of an applied magnetic field, as described in more detail in IBM's U.S. Pat. No. 5,729,410.

To develop a MTJ MR head for use as the sensor 40 in FIG. 2, various families of MTJ devices with relatively small areas of ~80×80 $(\mu m)^2$ were fabricated and tested to measure the magnetoresistance (MR) and specific resistance as a function of the thickness of the deposited aluminum layer that will become the insulating tunnel barrier layer. These MTJ devices were fabricated by using a series of three metal shadow or contact masks which were placed in near contact with the surface of the substrates on which the MTJs were deposited. During deposition of the layers which form the MTJ onto the substrate the materials comprising the layers were deposited through holes in the metal shadow masks, thereby defining the MTJ devices. Three shadow masks were used to define the bottom electrode, the $Al_2O_3$ tunnel barrier and the top electrode.

Figure 4A:
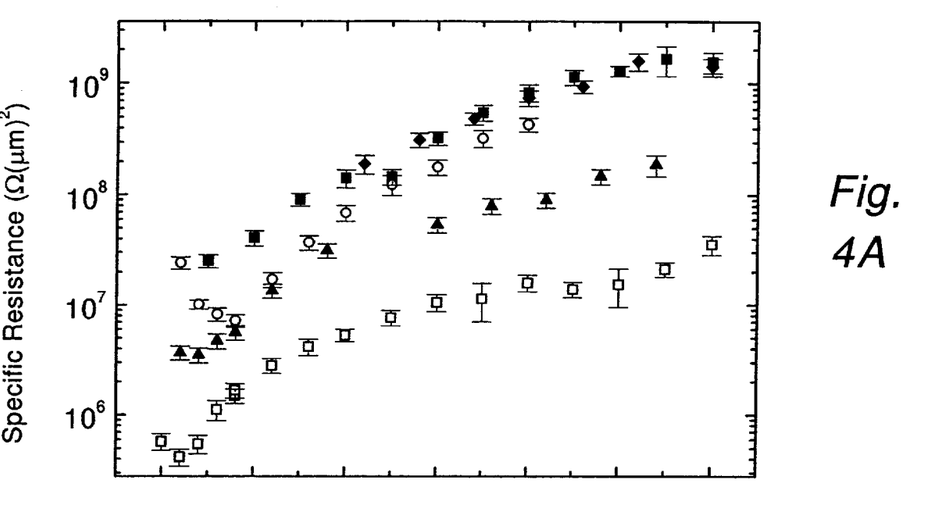
FIGS. 4A and 4B show the dependence of the specific resistance and magnetoresistance (MR), respectively, of various families of MTJ devices versus the thickness of the deposited aluminum layer which was subsequently plasma oxidized to form the tunnel barrier layer.
Figure 4B:
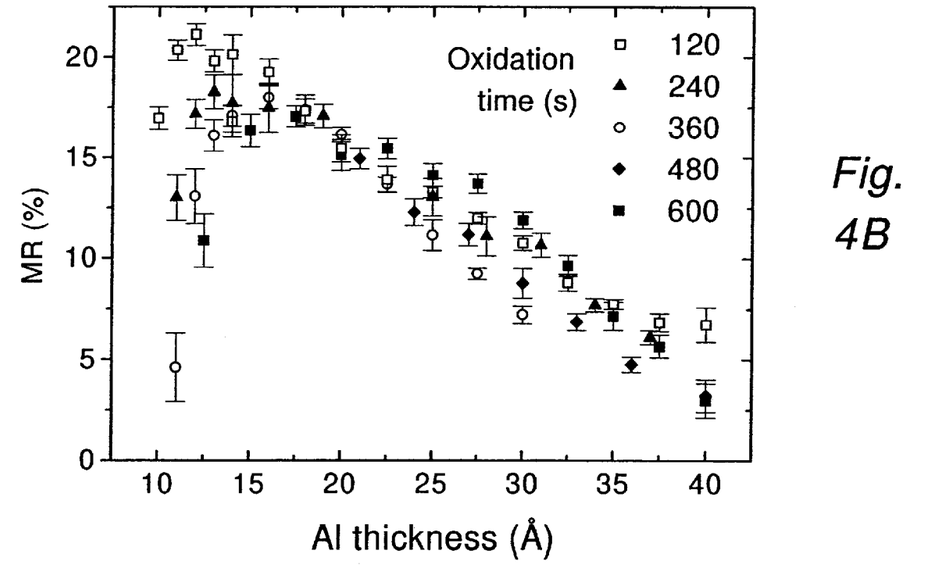

FIGS. 4A–4B show results for MTJ devices for which the tunnel barrier was formed by plasma oxidation of the deposited Al layer for Al thicknesses in the range of 10–40 Å. Each point in FIGS. 4A–4B represents the mean of 10 measurements and the error bars represent plus and minus one standard deviation from the mean. The structure of the MTJ device is 50 ÅTa/150 ÅAl/100 Å$Mn_{54}Fe_{46}$/30 Å$Ni_{81}Fe_{19}$/15 ÅCo/t (Å) Al oxidized for τ seconds/150 Å$Ni_{40}Fe_{60}$/200 ÅAl. After the exchange-biased lower ferromagnetic electrode and metallic Al layer were sputter deposited on a silicon wafer covered with a layer of $SiO_2$ the sample is brought within the same vacuum chamber close to a region where an oxygen plasma is formed. The plasma which contains energetic ionized oxygen species increases the rate of oxidation of the Al layer compared to oxidation in oxygen gas. The sample may be electrically biased to extract the energetic oxygen species. FIG. 4A compares the dependence of the specific resistance of the magnetic tunnel junctions for various thicknesses of deposited Al for different oxidation times (τ=120, 240, 360, 480 and 600 seconds). The specific resistance of the junctions increases both with increasing oxidation time and with increasing thickness of deposited Al. Note that the thickness of the deposited Al layer will be increased after oxidation. The specific resistance of the junctions can be readily varied from ~$10^5$–$10^9$ $\Omega(\mu m)^2$ by selecting the appropriate Al thickness. However, this range of specific resistance is not useful for most MTJ applications, especially for magnetic recording read heads. The magnetoresistance (MR) of these same junctions is shown in FIG. 4B. The MR is maximized for junctions for which the deposited Al layer thickness is less than ~13 Å. For thicker deposited Al thickness the MR decreases with increasing thickness of deposited Al. This is most likely caused by the incomplete oxidation of the deposited metallic Al layer. It is well known that oxidation of metallic Al results in passivation of the Al layer after the oxidation of the topmost several Al atomic layers. Thus for Al layers thicker than ~13 Å the Al layer is not completely oxidized and metallic Al will remain between the lower ferromagnetic electrode and the oxide formed at the surface of the Al layer that is to become the tunnel barrier layer. As discussed in IBM's U.S. Pat. No. 5,764,567, metallic Al in the tunnel barrier region results in a rapid suppression of the MR, which explains the decreased MR for thicker Al layers. Thus, as shown by FIG. 4B, it is not useful to form the tunnel barrier from Al layers thicker than ~13 Å because this leads to diminished MR. In addition, this most likely accounts for the low MR values reported by many previous workers. As shown in FIG. 4B, the MR is also reduced for Al layers thinner than some critical value which depends on the length of the time of the plasma oxidation. As shown in FIG. 4B, this critical value increases with increasing plasma oxidation time. The reduced MR in MTJs with thinner Al layers results from oxidation of the surface of the ferromagnetic layer. This most likely leads to spin-flip scattering which reduces the MR.

FIG. 4A shows that the specific resistance of the MTJs decreases as the thickness of the deposited Al layer is reduced and that the specific resistance has a very strong dependence on the thickness of the Al layer. In prior-art MTJ devices only thicknesses of Al greater than ~10 Å have been shown to be useful for forming tunnel barriers in magnetic tunnel junctions. For example Tsuge and Mitsuzuka (*Appl. Phys. Lett.* 71, 3296 (1997)) used Al layers of 20 Å, Sato and Kobayashi (*Jpn. J. Appl. Phys.* 36, L200 (1997)) used Al layers with thicknesses in the range 17–50 Å, Wong, Evetts and Blamire (*J. Appl. Phys.* 83, 6697 (1998)) used Al thicknesses in the range 10–13 Å. J. S. Moodera, E. F. Gallagher, K. Robinson and J. Nowak (*Appl. Phys. Lett.* 70, 3050 (1997) argue that optimal thicknesses for the formation of tunnel barriers in MTJs lie in the range 10–16 Å and that for thinner Al layers the barriers are of poor quality leading to junctions with very low and irreproducible MR values. Moreover J. S. Moodera, L. R. Kinder, T. M. Wong and R. S. Meservey (*Phys. Rev. Lett.* 74, 3273 (1995)) argue that it is not possible to obtain pin-hole free junctions by oxidation of thinner deposited Al layers and moreover that, in order to obtain pin-hole free barriers, even by oxidation of thicker deposited Al layers, that the metallic Al layer has to be deposited at cryogenic temperatures. Thus the prior art teaches that it is not possible to obtain pin-hole free Al layers thinner than ~10 Å and that for MTJ devices with such Al layers it is not possible to obtain significant MR values and specific resistance values lower than ~$10^3$–$10^4$ $\Omega(\mu m)^2$.

Preferred Embodiments

When the resistance of the MTJ is reduced and becomes comparable to the in-plane resistance of the lower and upper electrodes, the current flow through the MTJ will be non-uniform, which leads to incorrect measurements of specific resistance and MR values. To explore lower specific resistance values MTJs with smaller cross-sectional areas were investigated.

Figure 5A:
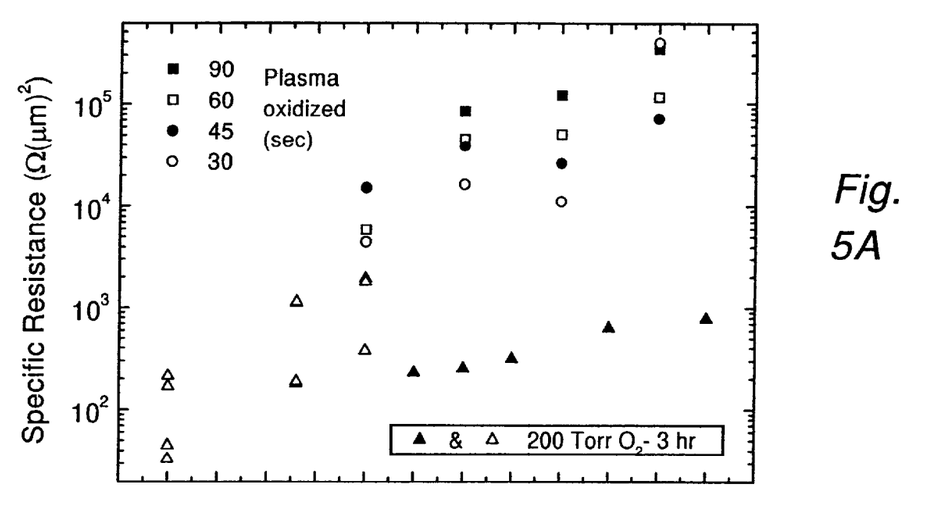
FIGS. 5A and 5B show the dependence of the specific resistance and magnetoresistance (MR), respectively, of various families of MTJ devices versus the thickness of the deposited aluminum layer which was subsequently oxidized to form the tunnel barrier layer.
Figure 5B:
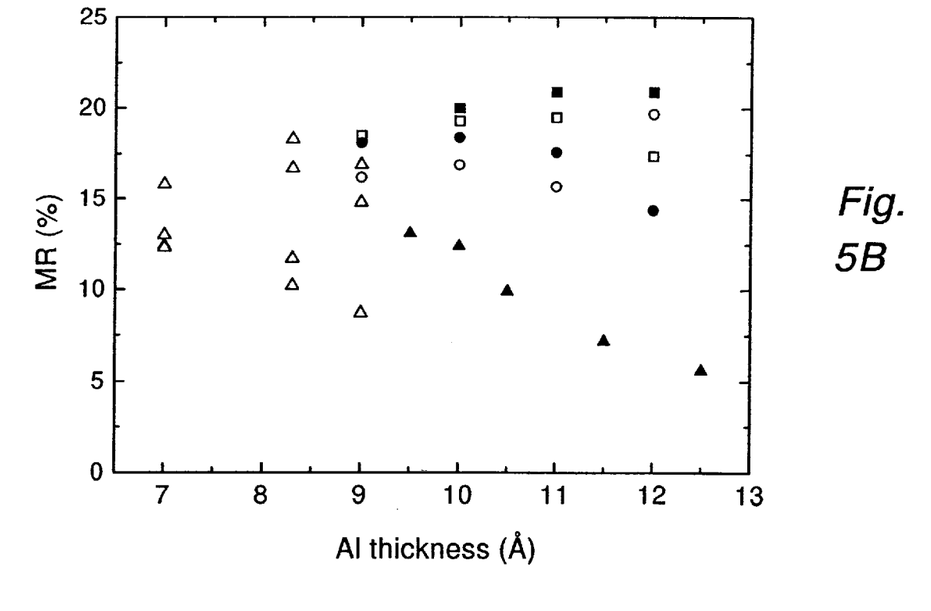
Figure 6A:
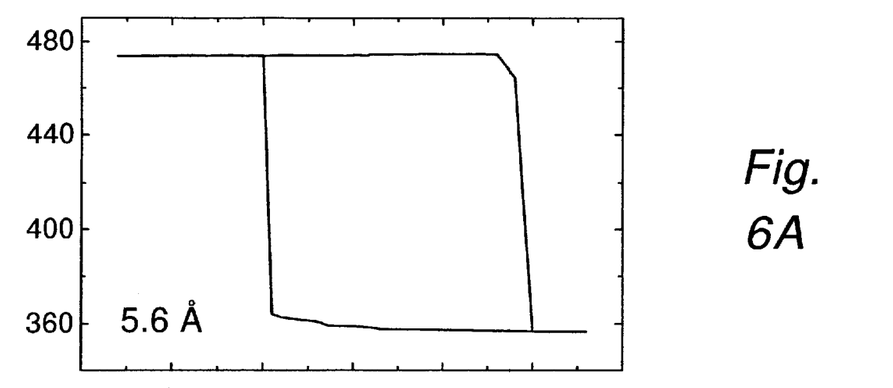
FIGS. 6A–6E show representative specific resistance versus field curves for a set of otherwise identical MTJ devices with relatively small areas of ~0.25 $(\mu m)^2$ for various thicknesses of the aluminum layer from which the tunnel barrier was formed.
Figure 6B:
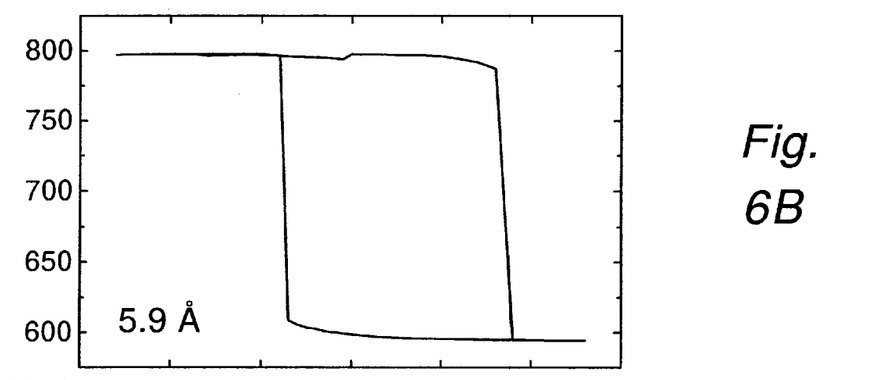
Figure 6C:
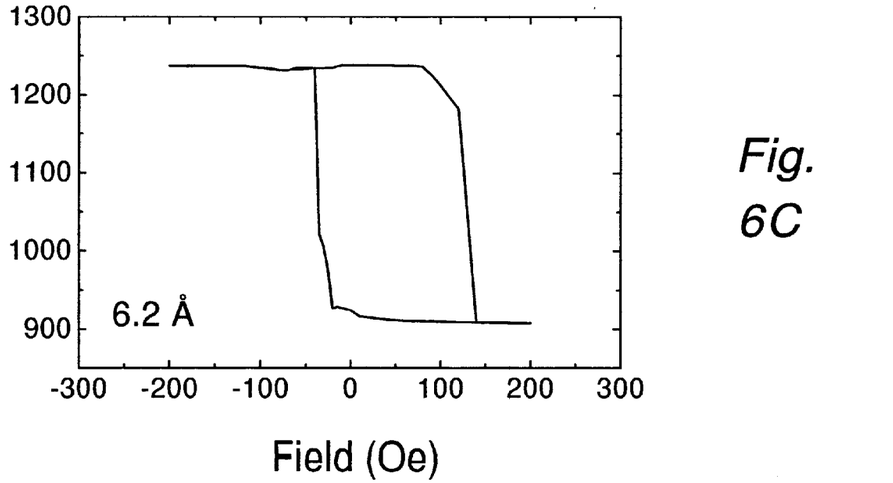
Figure 6D:
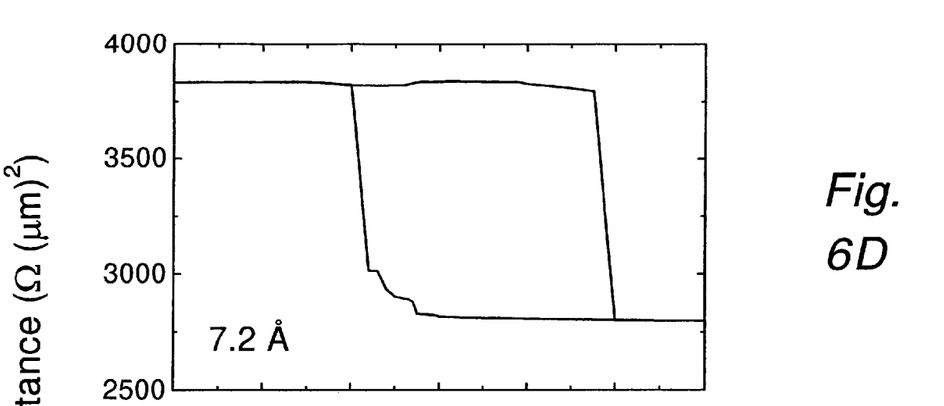
Figure 6E:
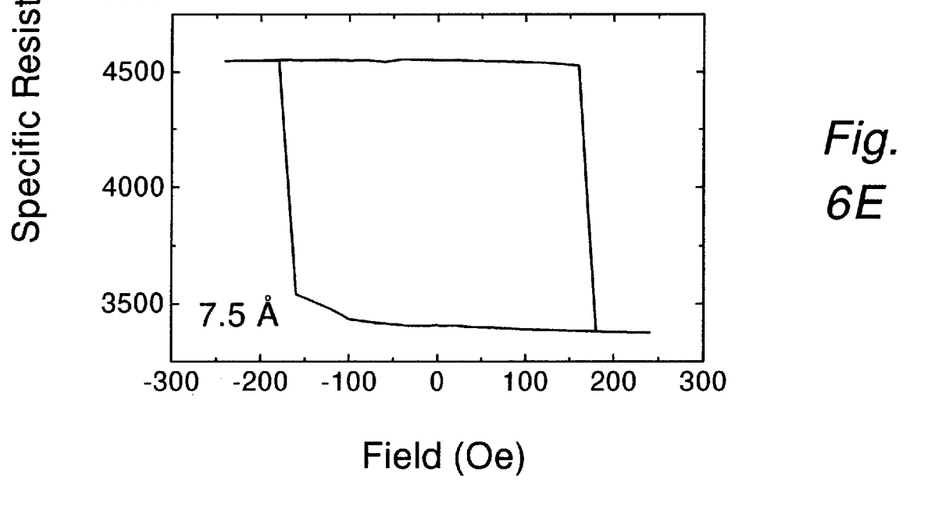

FIGS. 5A–5B show the dependence of specific resistance and MR on the thickness of the deposited Al layer for magnetic tunnel junctions whose area was defined by optical and/or e-beam lithography. Results are shown for MTJs with areas sufficiently small (approximately in the range of <1–10 $(\mu m)^2$) that the measured specific resistance and MR values are not affected by the non-uniformities in current flow present in large area MTJ devices. FIG. 5A shows that the specific resistance of tunnel junctions can be varied continuously from ~$3\times10^5$ $\Omega(\mu m)^2$ down to as little as ~20

$\Omega(\mu m)^2$ by reducing the Al thickness down to ~6 Å. In the MTJ structures in FIGS. 5A–5B, the tunnel barriers were formed either by plasma oxidation (data shown by circles and squares) similar to that used for the structures of FIGS. 4A–4B or by thermal or natural oxidation (data shown by triangles). The length of time of plasma oxidation ranged from 30–90 seconds (examples are shown for 30, 45, 60 and 90 seconds) and was adjusted depending on the thickness of Al, i.e., the thinner the Al layer the shorter is the time required for plasma oxidation. If the time of the plasma oxidation is too great for a particular thickness of Al, the Al layer is oxidized completely and the surface of the lower ferromagnetic electrode is oxidized, leading to reduced MR and higher junction resistance. FIG. 5A shows that the specific resistance of the MTJ decreases continuously as the thickness of the deposited Al layer is reduced for Al thicknesses ranging from 12.5 Å down to ~7 Å. In this range of Al thickness the specific resistance of the MTJ varies approximately exponentially with the thickness of the deposited Al layer, and, thus, approximately exponentially with the thickness of the oxidized Al layer. The oxidized Al layer will be thicker than the deposited Al layer because of the incorporation of oxygen in the Al film and the change in structure of the Al layer when it is converted to an oxide of approximate structure $Al_2O_3$ on oxidation. The specific resistance of the MTJ varies approximately exponentially with the deposited Al thickness only over the range of thickness of Al for which the Al can be completely oxidized. Thus for thicker Al layers the MTJ devices have reduced MR (as shown by FIG. 5B) because of incomplete oxidation of the Al layers. Thus there is a much stronger dependence of specific resistance on thin Al layers of ~7–12 Å (FIG. 5B), for which the Al is completely oxidized than for Al layers thicker than ~12–13 Å (FIG. 4B), for which only the upper portion of the Al layer is completely oxidized.

FIGS. 5A–5B also show specific resistance and MR data for MTJs in which the tunnel barrier is formed by natural or thermal oxidation of the deposited Al layer (data shown by triangles). In this case the deposited Al layer is exposed to oxygen which is introduced into the chamber. For the results shown, the Al layers were thermally oxidized at a pressure of 200 Torr in oxygen for 3 hours at room temperature. Thermal oxidation is a much slower method of oxidation than plasma oxidation because of the absence of ionized oxygen atoms or molecules and thus is not suitable for the oxidation of thicker Al layers because the length of time required for complete oxidation of the Al layer is too great for reasonable manufacturing processes. However, thermal oxidation is an excellent method for forming Al oxide layers for thin Al layers in the range of 5–9 Å. Moreover, FIG. 5A shows that in addition to obtaining low specific resistance values, large MR values can be obtained for Al layers much thinner than have previously been considered. This is most likely because prior art MTJ structures were not properly constructed to give rise to smooth Al layers or the Al layers were not fully oxidized without oxidizing the lower ferromagnetic electrode. As the Al layer is reduced in thickness the length of time of oxidation for plasma or thermal oxidation must be reduced. This is more important for plasma oxidation than for thermal oxidation because thermal oxidation is a much less aggressive process. Nevertheless the length of time of oxidation must be varied according to the thickness of the Al layer and must be decreased as the Al layer thickness is decreased. For natural or thermal oxidation the Al tunnel barrier layer can also be oxidized by exposure to air but the time required for oxidation must be reduced the greater is the humidity of the air. Moreover, for air oxidation, the samples can be removed from the vacuum chamber once the lower ferromagnetic electrode and the Al layer are deposited and the Al layer can be oxidized in air outside of the vacuum chamber. The process of thermal oxidation may also be accelerated by raising the temperature of the substrate during the oxidation process either inside the vacuum chamber or by breaking vacuum and oxidizing the Al layer outside the vacuum in air.

Figure 7A:
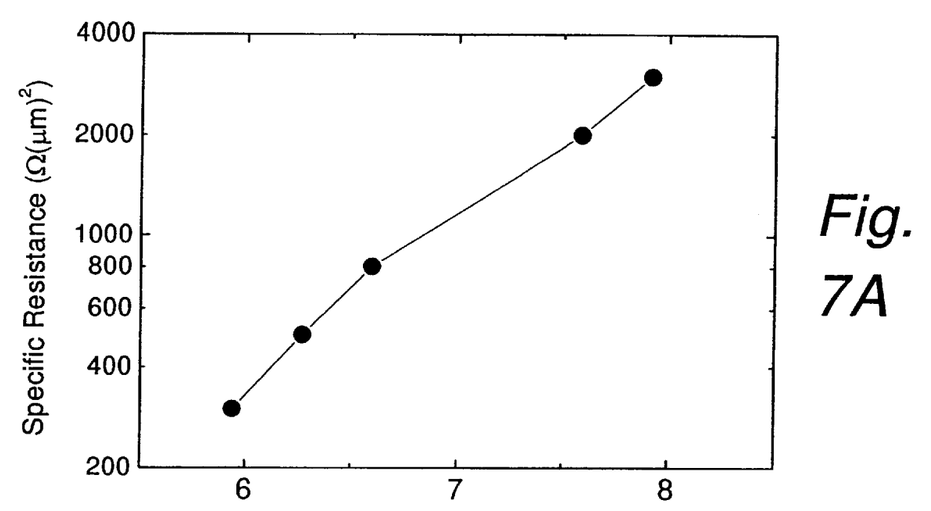
FIGS. 7A–7B show the dependence of the specific resistance and magnetoresistance, respectively, versus the thickness of the deposited aluminum layer which was subsequently thermally oxidized to form the tunnel barrier layer for the devices shown in FIGS. 6A–6E.
Figure 7B:
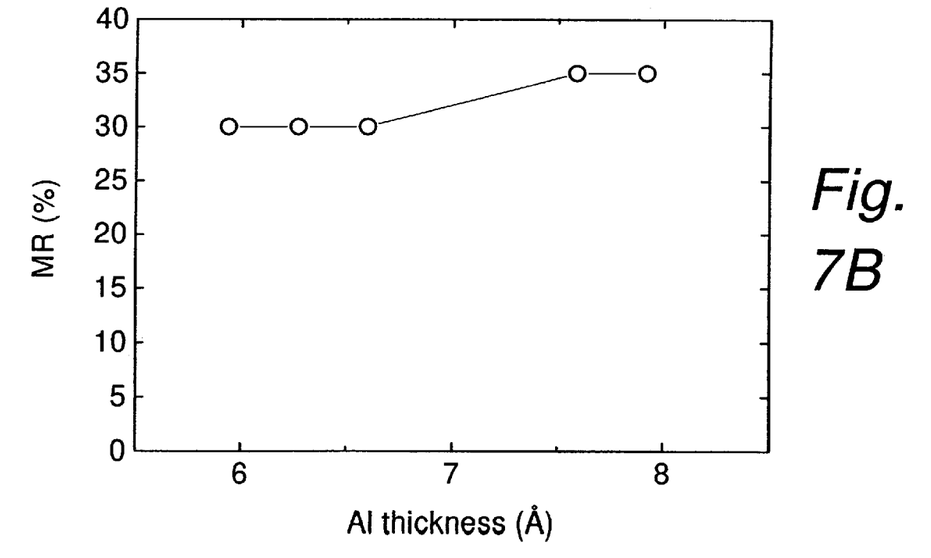

FIGS. 6A–6E show typical specific resistance versus field curves of a series of MTJ devices, each of size ~0.28 $\mu m \times 0.86$ $\mu m$ (0.25 $\mu m^2$), which have identical structures except for the thickness of the Al layer. The structure of the layers of these MTJ devices is 150 ÅTi/40 ÅNi$_{81}$Fe$_{19}$/120 ÅIr$_{22}$Mn$_{78}$/20 ÅCo$_{84}$Fe$_{16}$/t Al/15 ÅCo$_{90}$Fe$_{10}$/40 ÅNi$_{81}$Fe$_{19}$/100 ÅTi, and the Al layer thicknesses are (6A) 5.6 Å, (6B) 5.9 Å, (6C) 6.2 Å, (6D) 7.2 Å, and (6E) 7.5 Å. The Al layers were oxidized by breaking vacuum after deposition of the Al layer and exposing these layers to air for 60 minutes. The samples were then returned to the vacuum chamber and, after pumping out the chamber to achieve a sufficiently low base pressure, the top electrodes were deposited. The dependence of specific resistance and MR on deposited Al thickness for these structures is shown in FIGS. 7A–7B. FIG. 7A shows that the specific resistance can be readily varied by approximately one order of magnitude by varying the Al thickness by approximately 1–2 angstrom. FIG. 7B shows that these very small devices (area ~0.25 $(\mu m)^2$) exhibit very high MR values in the range 30–35% independent of the specific resistance of these devices for the range of Al thickness illustrated.

The specific resistance of the MTJ device for otherwise the same thickness of Al may be increased by increasing the exposure to oxygen. The oxygen exposure is measured in Torr-hours (T-hr). Referring again to FIG. 5B it is shown that the MR is reduced for thicker Al layers which is most likely because of incomplete oxidation of the Al layer. Large MR values can be obtained for thinner Al layers by choosing an appropriate exposure to oxygen. The MR value will also be affected by the composition of the ferromagnetic layers adjacent to the $Al_2O_3$ tunnel barrier.

Figure 8A:
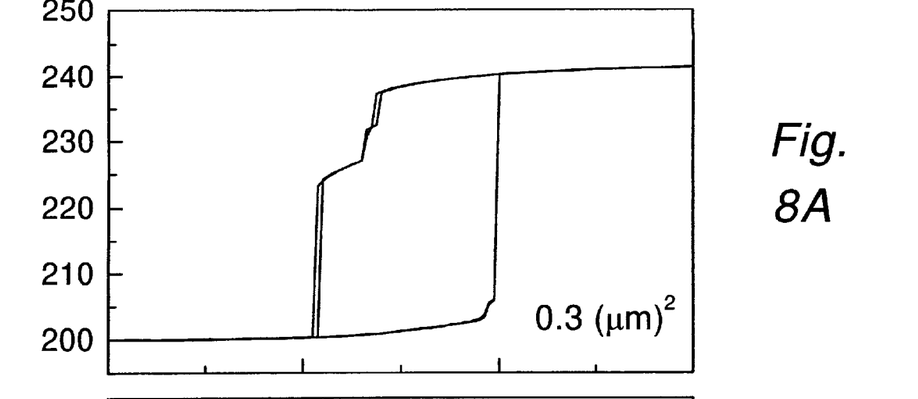
FIGS. 8A–8C show a series of resistance versus field curves for a set of lithographically defined junctions of various dimensions.
Figure 8B:
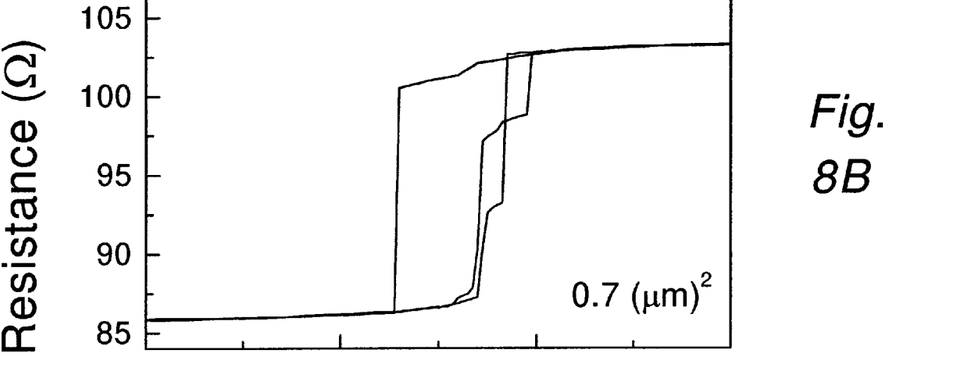
Figure 8C:
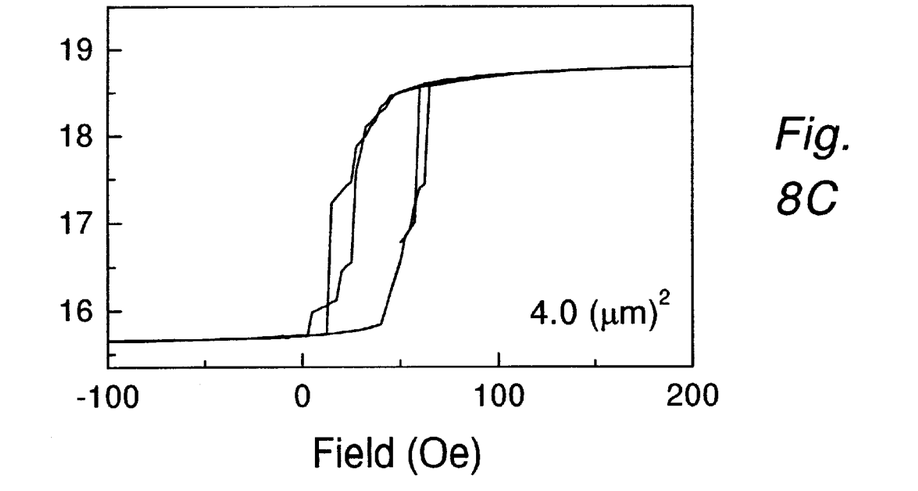
Figure 9A:
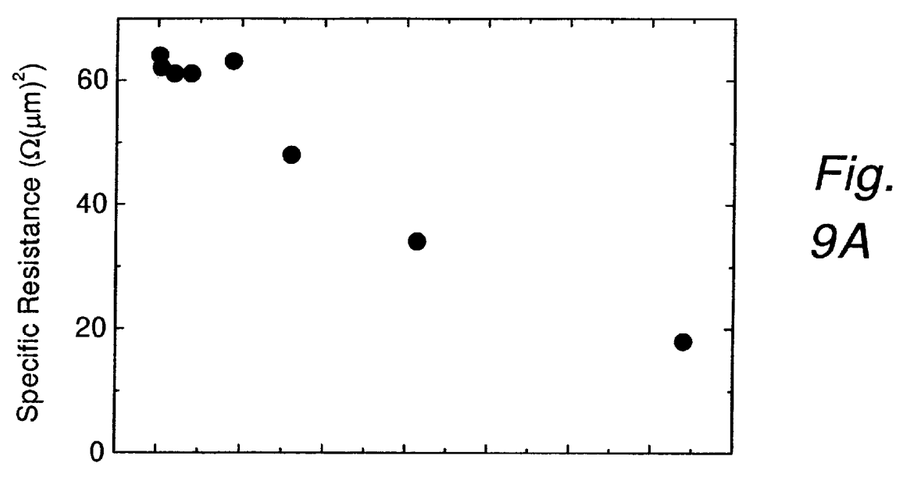
FIGS. 9A and 9B show the dependence of the specific resistance and magnetoresistance, respectively, on the area of a set of lithographically defined MTJ devices.
Figure 9B:
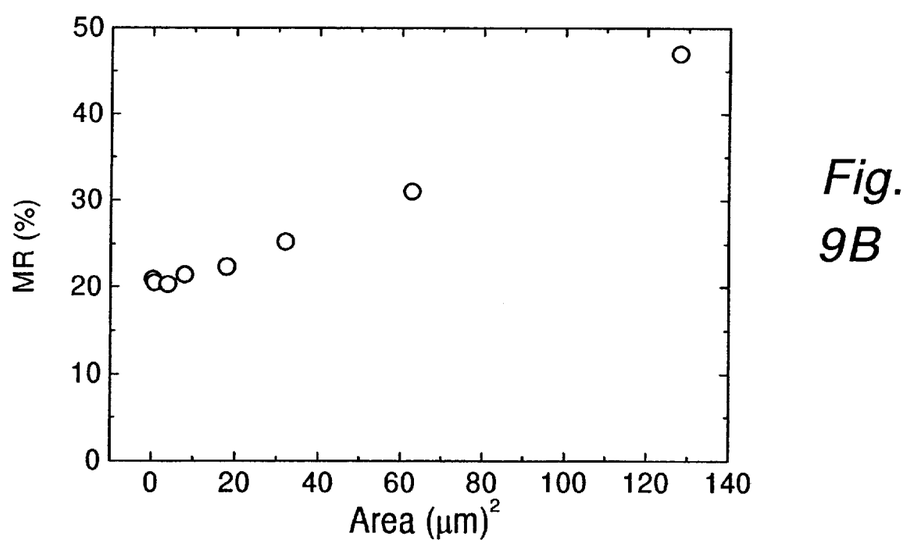

High MR values combined with low specific resistance values makes these MTJ devices highly suitable for MTJ read heads with very high SNR. FIGS. 8A–8C show a series of resistance versus field curves for a set of lithographically defined MTJ devices with identical structures and Al thicknesses (6 Å) and oxidation conditions, but with areas of (8A) 0.3, (8B) 0.7, and (8C) 4.0 $(\mu m)^2$. The structures are of the form 50 ÅTa/250 ÅAl/40 ÅNi$_{60}$Fe$_{40}$/100 ÅMn$_{46}$Fe$_{54}$/50 ÅCo/7 ÅRu/30 ÅCo/6 ÅAl/75 ÅNi$_{60}$Fe$_{40}$/240 ÅAl/75 ÅTa. The range of applied field is limited to that required to switch the magnetic moment of the free layer from being either parallel (negative field in FIGS. 8A–8C) or antiparallel (positive field in FIGS. 8A–8C) to the magnetic moment of the pinned ferromagnetic layer. The specific resistance of each of the junctions in FIGS. 8A–8C is ~61–64 $\Omega(\mu m)^2$ and the MR is ~20–22% independent of the area of the junction. Junctions with significantly larger areas have higher MR and lower resistance values because of non-uniform current flow through these junctions. This is illustrated in FIGS. 9A–9B which show the dependence of specific resistance and MR on the area of the MTJ device for devices including those of FIGS. 8A–8C as well as devices with much larger areas ranging up to 125 $(\mu m)^2$.

While the present invention has been particularly shown and described with reference to the preferred embodiments, it will be understood by those skilled in the art that various changes in form and detail may be made without departing from the spirit and scope of the invention. Accordingly, the disclosed invention is to be considered merely as illustrative and limited in scope only as specified in the appended claims.

What is claimed is:

1. A magnetic tunnel junction device comprising:

a substrate;

a first electrically conductive lead formed on the substrate;

a magnetic tunnel junction formed on the first lead and comprising (a) a fixed ferromagnetic layer having its magnetic moment fixed in a preferred direction in the absence of an applied magnetic field, (b) an insulating tunnel barrier layer of substantially completely oxidized aluminum oxide in contact with the fixed ferromagnetic layer, the material of the fixed ferromagnetic layer being unoxidized at its interface with the aluminum oxide layer, and (c) a sensing ferromagnetic layer in contact with the insulating tunnel barrier layer, the magnetic tunnel junction having an area less than approximately 4.0 square microns, a resistance-area product less than approximately 1000 ohm-(micron squared), and a magnetoresistance greater than approximately 20 percent; and a second electrically conductive lead formed over the magnetic tunnel junction.

2. The device according to claim 1 wherein the insulating tunnel barrier layer comprising aluminum oxide is formed from an aluminum layer having a thickness, prior to oxidation, in the range of approximately 5 to 12 Angstroms.

3. A magnetic tunnel junction magnetoresistive read head for sensing data magnetically recorded on a medium by the detection of changes in electrical resistance within the head when the head is connected to electrical circuitry, the head comprising:

a substrate;

a first electrically conductive lead formed on the substrate;

a magnetic tunnel junction formed over the first lead and comprising (a) a fixed ferromagnetic layer having its magnetic moment fixed in a preferred direction in the absence of an applied magnetic field, (b) an insulating tunnel barrier layer of substantially completely oxidized aluminum oxide in contact with the fixed ferromagnetic layer the material of the fixed ferromagnetic layer being unoxidized at its interface with the aluminum oxide layer, and (c) a sensing ferromagnetic layer in contact with the insulating tunnel barrier layer, the magnetic tunnel junction having an area less than approximately 4.0 square microns, a resistance-area product less than approximately 1000 ohm-(micron squared), and a magnetoresistance greater than approximately 20 percent; and a second electrically conductive lead formed over the magnetic tunnel junction stack.

4. The head according to claim 3 wherein the insulating tunnel barrier layer comprising aluminum oxide is formed from an aluminum layer having a thickness, prior to oxidation, in the range of approximately 5 to 12 Angstroms.

5. A magnetic tunnel junction memory cell having two magnetic states and usable in a nonvolatile magnetic memory array of memory cells, the array being connected to read/write circuitry for reading and writing to the memory cells in the array, the memory cell comprising:

a substrate:

a first electrically conductive lead formed on the substrate for connection to the read/write circuitry;

a magnetic tunnel junction formed over the first lead and comprising (a) a fixed ferromagnetic layer having its magnetic moment fixed in a preferred direction in the absence of an applied magnetic field, (b) an insulating tunnel barrier layer of substantially completely oxidized aluminum oxide in contact with the fixed ferromagnetic layer, the material of the fixed ferromagnetic layer being unoxidized at its interface with the aluminum oxide layer, and (c) a sensing ferromagnetic layer in contact with the insulating tunnel barrier layer, the magnetic tunnel junction having an area less than approximately 4.0 square microns, a resistance-area product less than approximately 1000 ohm-(micron squared), and a magnetoresistance greater than approximately 20 percent; and a second electrically conductive lead formed over the magnetic tunnel junction stack for connection to the read/write circuitry.

6. The memory cell according to claim 5 wherein the insulating tunnel barrier layer comprising aluminum oxide is formed from an aluminum layer having a thickness, prior to oxidation, in the range of approximately 5 to 12 Angstroms.

* * * * *